United States Patent [19]
Ueyanagi et al.

[11] Patent Number: 4,503,599
[45] Date of Patent: Mar. 12, 1985

[54] METHOD OF FABRICATING FIELD EFFECT TRANSISTORS

[75] Inventors: Kiichi Ueyanagi, Kokubunji; Susumu Takahashi, Nishitama; Yasunari Umemoto, Kokubunji; Michiharu Nakamura, Nishitama, all of Japan

[73] Assignee: Hitachi, Ltd., Tokyo, Japan

[21] Appl. No.: 462,014

[22] Filed: Jan. 28, 1983

[30] Foreign Application Priority Data

Jan. 29, 1982 [JP] Japan ................... 57-11664

[51] Int. Cl.³ .......................................... H01L 21/265
[52] U.S. Cl. ..................... 29/571; 29/576 B; 29/578; 29/579; 148/187
[58] Field of Search ...................... 29/571, 576 B, 578, 29/579; 148/187, 1.5

[56] References Cited

U.S. PATENT DOCUMENTS

| | | | |
|---|---|---|---|
| 4,033,788 | 7/1977 | Hunsperger et al. | 148/1.5 |
| 4,173,063 | 11/1979 | Kniepkamp et al. | 29/571 |
| 4,252,580 | 2/1981 | Messick | 29/571 X |
| 4,266,333 | 5/1981 | Reichert | 29/571 |
| 4,312,112 | 1/1982 | Calviello | 29/571 |
| 4,325,181 | 4/1982 | Yoder | 29/571 |
| 4,368,573 | 1/1983 | de Brebisson et al. | 29/576 B |
| 4,377,030 | 3/1983 | Pettenpaul et al. | 148/187 X |

OTHER PUBLICATIONS

Mar et al., *Solid State Technology*, "Properties of Plasma Enhanced CVD Silicon Nitride: Measurements and Interpretations", Apr. 1980, pp. 137–142.

*Primary Examiner*—G. Ozaki
*Attorney, Agent, or Firm*—Antonelli, Terry & Wands

[57] ABSTRACT

Herein disclosed is a field effect transistor fabricating method comprising: the step of forming a surface portion of a semiconductor substrate with an impurity region for a channel; the step of forming a first material layer, which has a width substantially equal to that of a gate electrode, in such a position on said semiconductor substrate and is to be formed with said gate electrode, a second material layer, which has a width larger than that of said first material layer, above said first material layer, and source and drain regions by an ion implantation using said first and second material layers thus formed as a mask; the step of forming source and drain electrodes in contact with said source and drain regions; the step of forming a third material layer, which has a selectivity with said first material layer in its etched characteristics, on the semiconductor body thus far prepared by the foregoing steps; the step of forming at least an aperture by removing said first material layer in a state using said third material layer as a mask; and the step of forming said gate electrode in said aperture.

18 Claims, 27 Drawing Figures

METHOD OF FABRICATING FIELD EFFECT TRANSISTORS

BACKGROUND OF THE INVENTION

The present invention relates to an FET (which is the abbreviation of a "field effect transistor") and contemplates to ensure a high speed of the FET by the self-alignment among component elements such as electrodes.

A major portion of an FET, which has its substrate made of GaAs, i.e., a chemical compound semiconductor, is shown in section in FIG. 1. This FET is operated by controlling the electric current, which flows through an n-type channel layer 4 formed between two ohmic electrodes formed on the surface of a semi-insulating semiconductor substrate 1, i.e., between a source electrode 2 and a drain electrode 3, by a signal input which is applied to a gate electrode 5. Its threshold voltage is controlled by changing the thickness of a depletion layer 6, which is formed below the gate electrode 5. Below the ohmic electrodes 2 and 3, moreover, there are formed $n^+$-type layers 7 and 8 which are generally intended to reduce the ohmic resistance.

The operating speed of that FET is determined mainly by the transconductance and the resistance between the source and the drain. In other words, the operating speed increases with increasing transconductance and with decreasing drain resistance. The transconductance is substantially in inverse proportion to a gate length 9 whereas the aforementioned resistance becomes the lower as both a channel length 10 and a gap 11 between the source and the drain are the smaller. In other words, it is necessary to reduce the lengths of these 9,10 and 11 to make the switching speed of the FET faster.

If these component elements such as the electrodes are prepared by the photo-lithographic process, these lengths are restricted by the precision of the process. Therefore, a variety of self-alignment processes have been developed as a method for patterning these component elements without resorting to a lithographic process.

However, any fabricating method capable of sufficiently achieving the practical objects has not been found yet.

Next, the problems accompanied with the prior art will be specifically pointed out.

FIG. 2 and FIGS. 3a to 3c show the examples of the FETs which are fabricated by the prior self-alignment processes.

In the example of the FET shown in FIG. 2, after the channel layer 6 has been formed, an ion implantation for forming $n^+$-type layers 7' and 8' is conducted by using a gate electrode 5' as a mask thereby to effect the self-alignment between the gate electrode 5' and the $n^+$-type layers 7' and 8'. In this way, the gap between the two $n^+$-type layers, i.e., a channel length 10' can be shortened.

However, this FET has a problem that a breakdown voltage between the gate electrode 5' and the $n^+$-type layers (7' and 8') is liable to be deteriorated. As the self-alignment cannot be effected between the source and drain 2 and 3 and the gate electrode, moreover, a source-drain gap 11' can't be shortened.

Another example of the FET is shown in FIGS. 3a to 3c. In this example, as shown in FIG. 3a, Si ions 16 for forming $n^+$-type layers 15 and 15' are implanted, as indicated at 16, through a $Si_3N_4$ layer 14 acting as a protective film of the substrate 1 by using a $SiO_2$ film 13 as a mask, which is formed in an overhung shape on a photo-resist film 12.

Next, after $SiO_2$ films 17 and 17' have been formed as coatings all over the surface by a sputtering process, as shown in FIG. 3b, the $SiO_2$ films 13 and 17' are lifted off by dissolving the photo-resist film 12 thereby to make the reversal of the mask, that is, the interchange of the covered portion of the GaAs surface from the gate electrode portion into another portion. After the $n^+$-type layers have been activated by an annealing process at a temperature higher than 800° C., then, the $Si_3N_4$ at the aperture of the $SiO_2$ film is removed. As shown in FIG. 3c, furthermore, a gate electrode 18 is fabricated at the aperture by the use of the lithographic process. On the other hand, source and drain electrodes 19 and 20 are formed by the lithographic process of the prior art.

In this way, the $n^+$-type layers 15 and 15' and the gate electrode 18 can be formed and separated from each other at the distance corresponding to the overhang length of the $SiO_2$ film 13. Even by this process, however, it is still impossible to effect the self-alignment between the gate electrode 18 and the source and drain 19 and 20. This is because, although the source and the drain have to be formed prior to the mask reversal and the anneal of $n^+$ layers in order to make the self-alignment, the metal used for the source and drain electrodes is thermally deteriorated at the annealing temperature (higher than 800° C.). And because of the presence of the photo-resist film 12, the annealing process cannot be conducted before coating the source and the drain. Therefore, a source-drain gap 21 (corresponding to the gap 11 of FIG. 1) cannot be narrowed.

Moreover, the positioning of an upper portion 18' of the gate electrode 18 cannot be made without photo-lithography so that its position not only becomes inaccurate but also it has to be made wider than the width of the original photo-resist film 12. As shown in FIG. 3c, therefore, that upper portion 18' is piled up on the $SiO_2$ film so that it is difficult to fabricate these elements in planar form. At the same time, since the $n^+$-type layer 15 and the gate electrode 18 overlie each other through the insulating film 17 so that the overlapped region acts as a capacitor, an input capacitance between the source electrode 19 and the gate electrode 18 is increased to deteriorate the characteristics of the FET.

SUMMARY OF THE INVENTION

It is the first object of the present invention to shorten the gap between a source region and a drain region as much as possible while maintaining the channel length of an FET short.

The second object of the present invention is to make the structure of said FET more planar.

The gist of the present invention is as follows. In such a position on a semiconductor substrate as is to be formed with a gate electrode, there are formed a first material layer, which has a width substantially equal to that of the gate electrode, and a second material layer which has a width larger than that of the first material layer. A representative of the method of preparing the first and second material layers will be described in connection with the following example. The first material layer is prepared into a predetermined shape by using the second material layer as a mask. In this case, at least the first material layer is made to have a width smaller than the mask width of the second material layer. This preparation can be conducted, as has been described in the above, because the first and second material layers have mutual selectivity during the preparing process.

Next, ions are implanted in accordance with ion implantation process by using the aforementioned first and second material layers as a mask, and a predetermined annealing process is conducted thereby to form source and drain regions. Moreover, source and drain electrodes are formed.

A third material layer having a selectivity with the first material layer in its etching characteristics is formed on the substrate thus far prepared. The aforementioned first material layer is removed in the state that the third material layer is used as a mask. A gate electrode is formed in an aperture which is opened by the removing step.

Thus, the FET of the present invention is completed.

In the present invention, the reverse pattern of the first mask, i.e., the mask used for forming an n+-type region (29) is formed by using the first, second and third material layers. In order to form the gate electrode by using that reverse pattern, not only the n+-type region but also the source and drain electrodes are formed in self-alignment with the gate electrode. This self-alignment is remarkably effective for the high-speed operation of the FET.

The materials for the aforementioned first and second materials are widely selected from the materials having the following properties:

(1) They have mutual selectivities when they are etched; and
(2) They have a heat-resistance. This is because they have to stand the annealing process after the ion implantation into the semiconductor substrate.

A variety of methods can, of course, be used for selective-etching the aforementioned second material layer. The etching methods may be the usual wet etching, plasma etching or chemical dry etching, for example.

The aforementioned third material layer is usually made of an organic high-molecular weight material which is represented by photo-resist. This third material layer may be constructed of multi-layers. Multi-layers constructed by an inorganic material and an organic material such as $SiO_2$, SiN or polysilicon may be used for the third layer. The method of the present invention is advantageous in that those inorganic materials can be used as they are as the passivation layer on the semiconductor surface.

Prior to the formation of the aforementioned first material layer, on the other hand, a protective film may be formed on the surface of the semiconductor substrate. As customary, this protective film is used to protect the crystal surface and may be removed before the source and drain electrodes are formed.

Examples for selecting the materials of the aforementioned respective layers are tabulated in Table 1; and the etching method is exemplified in Table 2:

TABLE 1

| | Protective Layer on Surface of Semiconductor Substrate | First Material Layer | Second Material Layer | Third Material Layer | |
|---|---|---|---|---|---|
| | | | | Omissible Layer | Organic Material Layer |
| 1 | No | SiN | $SiO_2$ | $SiO_2$ poly Si | Photo-resist |
| 2 | No | $SiO_2$ | SiN | SiN poly Si | Photo-resist |
| 3 | SiN | poly Si | $SiO_2$ | SiN | Photo-resist |
| 4 | SiN | Ti, Mo, $TiSi_2$, $MoSi_2$ | $SiO_2$ | SiN poly Si | Photo-resist |
| 5 | $SiO_2$ | poly Si | SiN | $SiO_2$ | Photo-resist |
| 6 | $SiO_2$ | Ti, Mo, $TiSi_2$, $MoSi_2$ | SiN | $SiO_2$ poly Si | Photo-resist |

TABLE 2

| Material to Be Etched | Wet Etching | Dry Etching |
|---|---|---|
| $SiO_2$ | HF | $CF_4$ (Reactive Ion Etching) |
| SiN | $H_3PO_4$ | $CF_4$ (Reactive Ion Etching) $CF_4$ (Plasma Etching) |
| Ti | HF | $CF_4$ (Reactive Ion Etching) $CF_4$ (Plasma Etching) |
| poly Si | — | $CF_4$ (Reactive Etching) $CF_4$ (Plasma Etching) |

DESCRIPTION OF THE PREFERRED EMBODIMENTS

EXAMPLE 1

FIGS. 4a to 4h show the steps of fabricating an FET as a first embodiment of the present invention. Although a usual semi-insulating GaAs substrate is used as the substrate, semiconductor substrates made of InP, InGaP or the like may be used in accordance with the purposes intended.

Figure 4A:
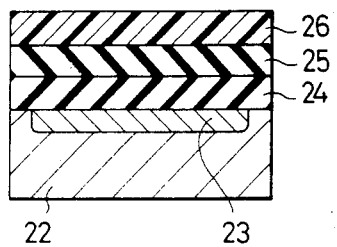
FIGS. 4a to 4h are sectional views showing the respective steps of a method embodying the present invention.

As shown in FIG. 4a, a GaAs substrate 22, in which a channel layer 23 having a depth of 2000 Å is formed by the well-known ion implantation method, is coated with a first material layer, a $Si_3N_4$ film (which has a thickness larger than 0.6 μm) 24, and a second material layer, a $SiO_2$ film (which has a thickness about 0.6 μm) 25, both being highly refractory films. In order to form the channel layer, the implanting energy was 125 KeV, and the dose density was $5 \times 10^{12}$ $cm^{-2}$. Moreover, a photo-resist film 26 is coated on the film and is exposed through a mask pattern for the n-type layer, and then developed. In this Example, the $Si_3N_4$ film is the material for the first layer, and the $SiO_2$ film is the material for the second layer. These first and second layers have their thicknesses selected from a range of 0.4 to 1 μm.

Figure 4B:
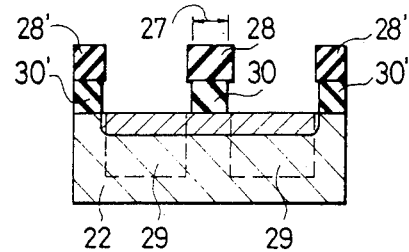

By the use of the pattern of the photo-resist thus formed, the inorganic insulating films 25 and 24 underlying are etched to expose the surface of the GaAs, as shown in FIG. 4b. At the same time, the pattern of the gate electrode by the insulating film is formed. The $SiO_2$ film 25 is etched with an etchant mainly consisting of hydrofluoric acid, whereas the $Si_3N_4$ is etched by the reactive plasma etching process using $CF_4$ gas. At this time, the film 30 is slightly side-etched so that the film 30 on the GaAs surface can have a width 27 smaller than the pattern width of the resist film.

Figure 4C:
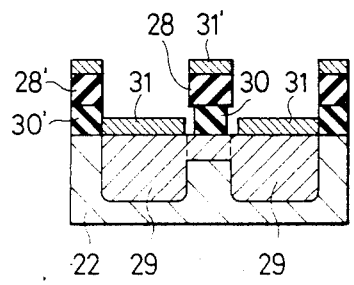

Next, in order to form the $n^+$-type layer 29, Si ions are implanted (with the implanting energy of 150 KeV and at a dose density of $1 \times 10^{13}$ cm$^{-2}$) by using these $SiO_2$ films 28 and 28' as a mask. The $n^+$-type layer 29 (which has a depth of 3000 Å) is activated by annealing at 800° C. for ten minutes. Next, an ohmic electrode 31 and a metal layer 31' are coated by the vacuum deposition (as shown in FIG. 4c). Thus, the ohmic electrode 31 and the $n^+$-type layer 29 are self-aligned for the gate electrode without any photo-lithographic process. The ohmic electrode 31 is constructed of a multi-layered film of AuGe/Ni/Au, which have thicknesses of 2000 Å, 500 Å and 500 Å, respectively. After the coating process, this electrode is alloyed to the $n^+$-type layer by the heat treatment at 400° C. for three minutes thereby to make the ohmic contact. After this formation of the ohmic electrode, the $Si_3N_4$ of the first layer may be side-etched further at its gate electrode pattern portion 30.

Figure 4D:
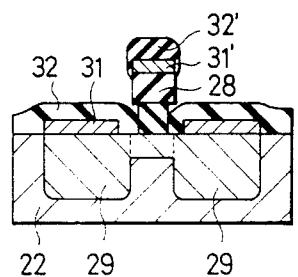
Figure 4E:
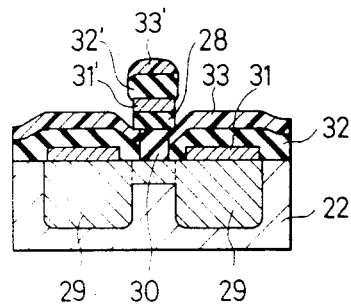
Figure 4F:
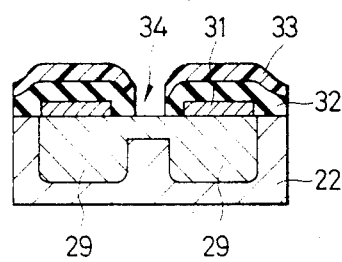

After this heat treatment, the $SiO_2$ film 28' and the $Si_3N_4$ film 30' are removed by the photo-lithographic process, and the GaAs substrate is coated all over its surface with $SiO_2$ films 32 and 32' by a plasma CVD (as shown in FIG. 4d). The gate electrode pattern is buried with $SiO_2$. Those films are made to have a thickness of about 3000 Å. The films are further coated, as shown in FIG. 4e, with photo-resist films 33 and 33' of about 6000 Å thereby to cover the $SiO_2$ film 32. After that, the $SiO_2$ film 28 at the gate portion is dissolved by etchant consisting of hydrofluoric acid to lift off the overlying metal film 31' or the like. This lift-off process may be replaced by the ion milling method or the plasma etching. After that, the $Si_3N_4$ film 30 is plasma-etched with the $CF_4$ gas so that the GaAs surface below the gate is exposed to form the pattern reversed from the original mask (as shown in FIG. 4f). The gate electrode pattern may be buried only with the resist films (33 and 33') without any use of $SiO_2$ film 32.

Figure 4G:
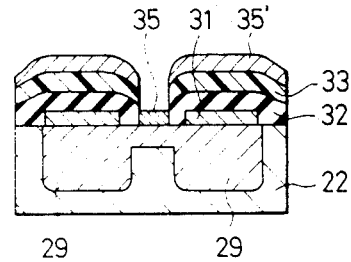

A gate metal 35 which is constructed of multilayered films of Ti/Pt/Au is coated at gate electrode portion 34 (as shown in FIG. 4g), which have thicknesses of 2000 Å, 500 Å and 3000 Å, respectively. On the other hand a metal film 35' sticking to a portion other than the gate portion is lifted off by dissolving the resist film 33.

Figure 4H:
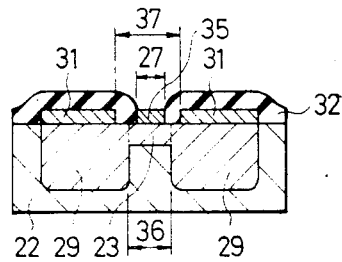

Thus, it is possible to fabricate the FET which has its $n^+$-type layer 29 and ohmic electrode 31 self-aligned with the gate electrode 35, as shown in FIG. 4h. In this FIG. 4h, 36 is the channel length and 37 is the gap between the source and drain electrodes.

Moreover, the gate length 27 can be made narrower than the minimum pattern width that can be realized in the photo-resist film, because the width of the resist film can be narrowed to the side-etching extent of the films 28 and 30. Still moreover, since the $n^+$-type layer and the ohmic electrode 31 are self-aligned with that gate, the gap inbetween can be far more shortened than the prior art.

Furthermore, the GaAs surface is completely covered with the ohmic electrode 31, the gate electrode 35 and the $SiO_2$ film so that the FET having a highly planar surface can be fabricated.

As shown in FIG. 4a, on the other hand, although the multi-layered film is made of the $Si_3N_4$ film as its lower sub-layer and the $SiO_2$ film as its upper sub-layer, the present invention should not be limited thereto. The multi-layered film may be widely selected from any films if these films have mutual chemical selectivities and are highly refractory. For example, selection is suitably made from poly silicon, PSG (i.e., phosphorous glass), metal silicide, nitrides of metal (which may be selected from Ti, Cr, Mo, Pt and so on) and so on. Moreover, the third film 32 coated after the coating process of the ohmic electrode should not be limited to $SiO_2$ but may be widely selected from any film if this film has a selectivity with the film 24 of the first layer.

EXAMPLE 2

Figure 5A:
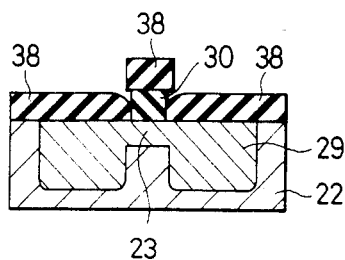
FIGS. 5a to 5c, FIGS. 6a to 6c, FIGS. 7a to 7f, and FIGS. 8a and 8b are sectional views showing the respective steps of methods according to other embodiments of the present invention.
Figure 5B:
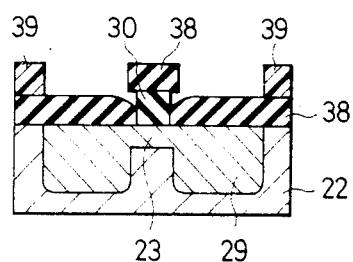
Figure 5C:
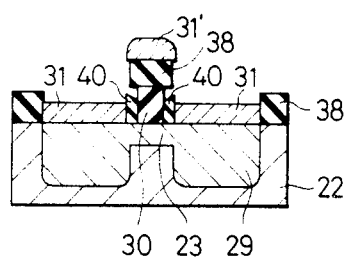

FIGS. 5a to 5c show the steps of fabricating the FET as another embodiment of the present invention. FIG. 5a shows the preparation of the following state by the sequential steps similar to those of the first embodiment. More specifically, the channel layer 23 is first formed on the GaAs substrate 22. On this channel layer 23, there is formed an $n^+$-type layer forming mask which has a laminated construction of the $Si_3N_4$ film and the $SiO_2$ film, both of which are inorganic insulating films having highly refractory properties. Using this mask, the $n^+$-type layer 29 is formed by the ion implantation, followed by the annealing process. In a manner to leave the portion corresponding to the gate portion, the multi-layered films (i.e., the $Si_3N_4$ film and the $SiO_2$ film) of the other portions are removed, and the whole surface is coated with a $SiO_2$ film 38 (as shown in FIG. 5a).

In this case, since there is no ohmic electrode yet, the $SiO_2$ film 38 can be formed as a coating in contact with the $Si_3N_4$ film 30. This $Si_3N_4$ film is the mask portion which is formed by preparing the first material layer.

Then, photo-resist film 39 is coated on the substrate, and is exposed using the mask pattern of the ohmic electrode, and developed (as shown in FIG. 5b). Thus the $SiO_2$ film 38 of the ohmic electrode portion is exposed, and the $SiO_2$ film of that portion (that is, the ohmic electrode portion) is removed by the dry etching.

The GaAs surface of the ohmic electrode portion thus exposed is coated with the metal for the ohmic electrode. Thus, this ohmic electrode 31 is completely insulated from the gate portion by the $Si_3N_4$ film 30 and the $SiO_2$ film 40. After the coating process of the ohmic electrode 31, the FET is also completed by the process similar to that of the first embodiment.

EXAMPLE 3

Figure 6A:
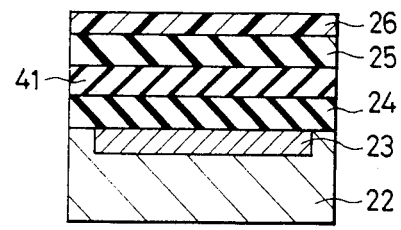
Figure 6B:
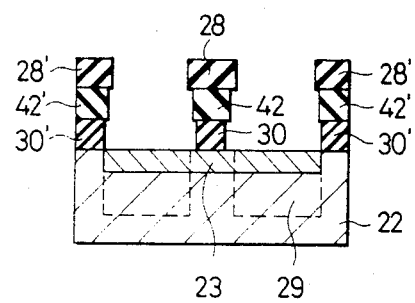
Figure 6C:
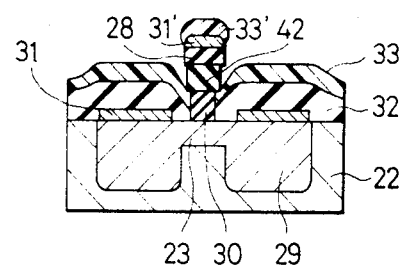

FIGS. 6a to 6c show a third embodiment of the present invention.

In this example, the two-layered films 24 and 25 (i.e., the two layers of $Si_3N_4$ and $SiO_2$) used in the first example are replaced by the $Si_3N_4$ film 24, a TiN film 41 and the $SiO_2$ film 25 overlying on the semi-insulating GaAs semiconductor substrate 22 (as shown in FIG. 6a).

These respective film thicknesses are all about 6000 Å. Film 41 should not be limited to TiN but may be made of any film if this film has a chemical selectivity with the $Si_3N_4$ film 24. For example, metal such as Mo, Cr or Ti, or their silicides can be used.

This three-layered film has been formed as a coating, and the three layers are consecutively etched by the use of the photo-lithography likewise the first example thereby to expose the GaAs surface to the outside, as shown in FIG. 6b. In this case, the first material layer 30 is made to have a width smaller than that of the overlying second material layer. Reference numeral 26 indicates a photo-resist layer which is used to prepare the laminated structure of inorganic insulating substances. Likewise as in the first example, moreover, after the formation of the $n^+$-type layer 29 and the subsequent coating of the ohmic electrode 31 (simultaneously with the formation of the metal layer 31'), the $SiO_2$ film 32 and the photo-resist film 33 are deposited.

The gate electrode portion is covered with the $Si_3N_4$ film 30, a TiN film 42 and the $SiO_2$ film 28, which is positioned more than 1 $\mu$m higher than the GaAs surface so that the lift-off using the photo-resist film 33 can be facilitated (as shown in FIG. 6c).

After this lift-off, the films 42 and 33 are dissolved with the etchant consisting of hydrofluoric acid to expose the GaAs surface of the gate portion to the outside. After that, the FET is completed likewise as in the first example.

EXAMPLE 4

Figure 7A:
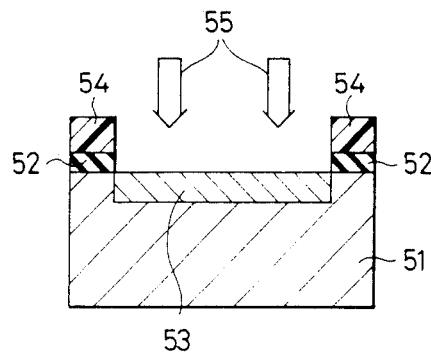
Figure 7B:
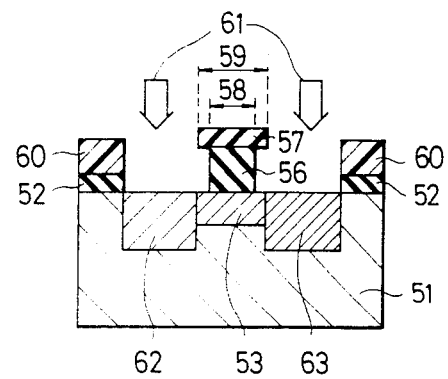
Figure 7C:
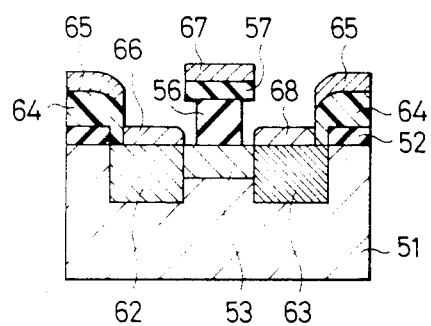
Figure 7D:
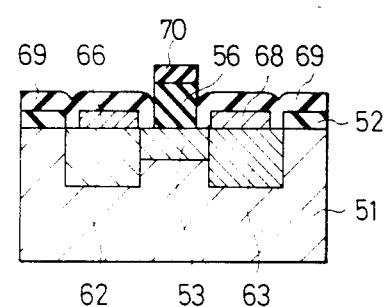
Figure 7E:
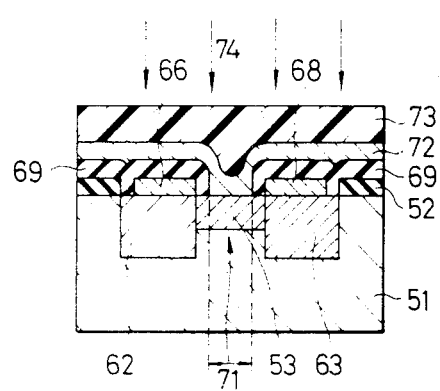
Figure 7F:
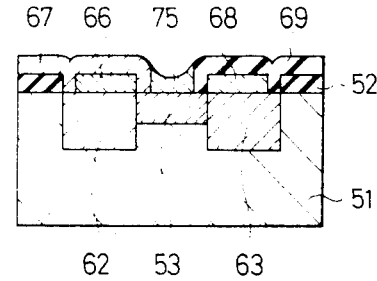

A GaAs semi-insulating substrate 51 is coated with a $SiO_2$ film 52 having a thickness of about 3500 Å, and the portion of the $SiO_2$ film corresponding to an active layer 53 is removed by the photo-lithographic technique. At this time, however, a photo-resist 54 (which has a thickness of about 1 $\mu$m) acting as a mask is left as is. After that, $Si^+$ ions 55 are implanted by using the photo-resist 54 and the $SiO_2$ film 52 as a mask (as shown in FIG. 7a). After that, the photo-resist is removed. Next, as shown in FIG. 7b, the whole surface is covered with a $Si_3N_4$ film 56 having a thickness of about 7000 Å and a $SiO_2$ film having a thickness of about 5000 Å in the recited order, and that $SiO_2$ film 57 is prepared in the form of a gate pattern by the photo-lithographic technique. Moreover, the $Si_3N_4$ film 56 is etched using the $SiO_2$ film 57 as a mask by dry etching technique using $CF_4$ gas. At This time, as shown in FIG. 7b, the $Si_3N_4$ is side-etched so that its length 58 becomes smaller than the length 59 of the $SiO_2$ film 57. By making use of this construction, source and drain regions 62 and 63 are formed by the implantation of Si ions 61 with the use of a mask made of a photo-resist 60 and the $SiO_2$ film 52 and by annealing at a high temperature after the resist 60 is removed. Next, as shown in FIG. 7c, the regions of the source and drain electrodes are restricted by a photo-resist 64 (which has a thickness of 1 $\mu$m), and all the substrate surface is coated with metal layers 65, 66, 67 and 68 having a total thickness of about 3500 Å for the source/drain electrodes. The unnecessary metal layers 65 and 67 are removed by resolving the $SiO_2$ film 57 and the photo-resist 64, thus the source and drain electrodes 66 and 68 are formed. The metal layers for the source and drain electrodes are made of a multi-layered film of AuGe/Ni/Au. At this time, the $SiO_2$ film 57 is first removed with the hydrofluoric acid, and the photo-resist 64 is then removed by the use of a resist peeling agent. Thus, it is possible (1) to shorten the gap between the gate electrode and the source electrode and (2) to form the source and drain regions having a high impurity concentration. Next, after the whole surface is coated with a $SiO_2$ film 69 having a thickness of about 1000 Å, as shown in FIG. 7d, the thickness of the $Si_3N_4$ film 56 is larger than the sum of the thicknesses of the $SiO_2$ film 69 and the source and drain electrodes 66 and 68 so that the space between the $Si_3N_4$ film 56 and the source and drain electrodes 66 and 69 is occupied by the $SiO_2$ thereby to separately leave a $SiO_2$ film 70 on the $Si_3N_4$ film 56. After that, a $SiO_2$ film aperture 71 for the gate electrode is formed, as shown in FIG. 7e, by removing the $Si_3N_4$ film 56 with the $CF_4$ gas; by removing the $Si_3N_4$ film the $SiO_2$ film 70 becomes free and can easily be washed out. A gate electrode metal 72 having a thickness of about 3500 Å is deposited at this aperture. Moreover, a photo-resist 73 having a low viscosity is applied thereto, and $Ar^+$ ions 74 are used for an ion milling process. By this method, the gate electrode metal is left only on the aperture of the $SiO_2$ film even if the gate metal on the $SiO_2$ film 69 is removed. In this way, as shown in FIG. 7f, a gate electrode 75 is formed, thus completing the self-alignment type field effect transistor. In this way, the gate electrode is formed after the high temperature annealing process.

Figure 1:
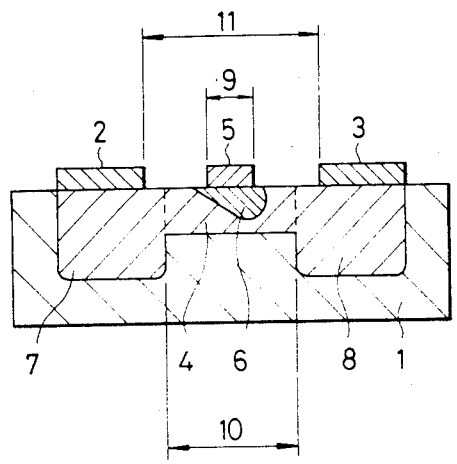
FIG. 1, FIG. 2 and FIGS. 3a to 3c are sectional views showing field effect transistors according to the prior art.
Figure 2:
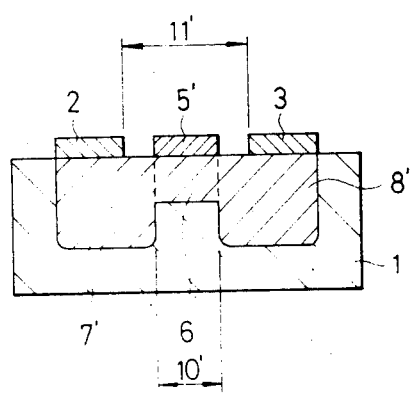
Figure 3A:
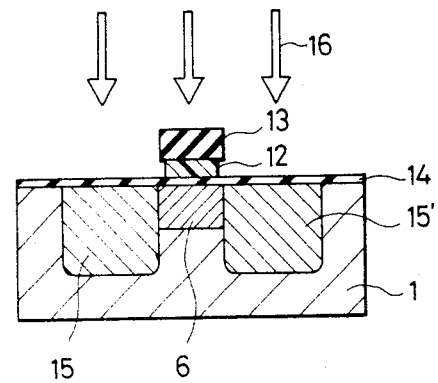
Figure 3B:
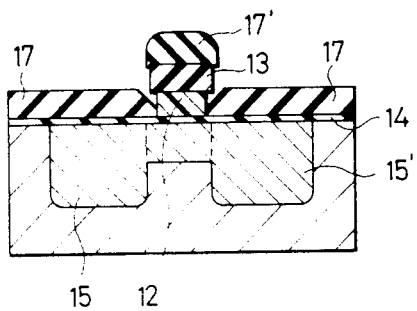
Figure 3C:
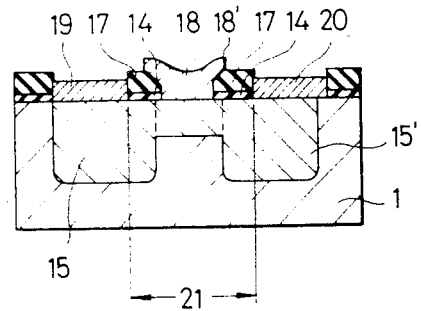

According to the fabricating method thus far described in the present example, the source and drain electrodes 66 and 68 (at the step of FIG. 7c) and the gate electrode 75 (at the step of FIG. 7e) can be formed in self-alignment with the source and drain regions 62 and 63. By this self-alignment, it becomes possible to raise the impurity concentration between the gate electrode and the source electrode, to shorten the gap between the two electrodes, and to provide the source and drain regions having a high impurity concentration. According to the fabricating method of the present example, therefore, the series resistance can be reduced to one sixth of that of the self-alignment type transistors (as shown in FIGS. 2 and 3) so that the transconductance can be accordingly augmented to a level 1.5 times as high as that of the prior art. According to the fabricating method of the present example, moreover, the gate electrode can be formed at the step of FIG. 7e after the high temperature annealing step of FIG. 7b so that the range of selection of the metal materials for the gate electrode is widened. In the fabricating method by which the high temperature annealing process is conducted after the formation of the gate electrode, for instance, the candidates for the electrode metal are restricted to Ti, W and an alloy of Ti/W at the most. According to the fabricating method of the present invention, on the contrary, all the metal elements for forming the Schottky barrier on GaAs can be enumerated as the candidates. An accompanying effect obtainable is that, since the $Si_3N_4$ film 56 is subjected to the side etching at the step of FIG. 7b, there is established a slight gap, as shown in FIG. 7f, between the gate electrode 75 and the source and drain regions 62 and 63 so that the gate breakdown voltage in the backward direction can be made a sufficient level.

Figure 8A:
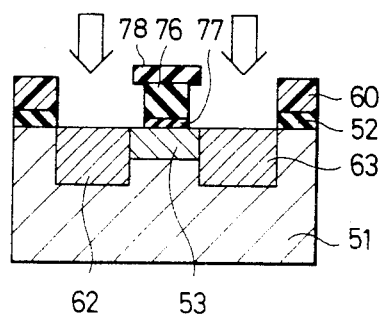
Figure 8B:
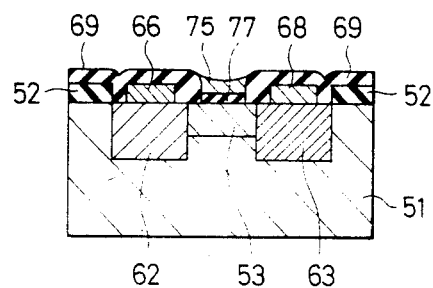

Although the foregoing examples have been made by taking the GaAs as an example, the fabricating method of the present invention should not be limited to thereto but can, of course, be applied to all semiconductors. Moreover, the foregoing examples have been described by taking the $SiO_2$ and $Si_3N_4$ as an example of the two-layered insulating film of FIG. 7b. This may be generally widened up to any kind of materials composed of any combination, if the paired materials can withstand a high temperature and have a relationship in which one of them is etched but the other is not. (For example, the $Si_3N_4$ may be replaced by polycrystalline Si.) Furthermore, the present invention should not be limited to the Schottky contact type transistor but can fabricate such an MIS (i.e., Metal-Insulator-Semiconductor) type field effect transistor as is shown in FIG. 8b, if three material layers 76, 77, and 78 shown in FIG. 8a are used. In FIGS. 8a and 8b, incidentally, the identical reference numerals indicate the portions identical to those of FIGS. 7a to 7f.

Thus, the excellent insulated gate type field effect transistor can be realized in accordance with the gist of the present invention even if such a fourth material is coated prior to the coating process of the first material as is not etched by the method of etching the first and second materials but prevents the first and second materials from being etched by its fabricating method.

As has been described hereinbefore, according to the present invention, it is possible to fabricate the fastest self-alignment type field effect transistor which can have its series resistance reduced about one sixth as high as that of the conventional self-alignment type transistor and which can allow a high current to flow therethrough.

Although the foregoing description has been directed to the example of the FET using the GaAs substrate, the present invention can naturally be applied to the fabrication of the FET which uses not only the GaAs substrate but also a semiconductor substrate of III and V groups such as GaAlAs or InP.

What is claimed is:

1. A method of fabricating a field effect transistor, comprising:
   the step of forming a surface portion of a semiconductor substrate with an impurity region for a channel;
   the step of forming a first material layer above said semiconductor substrate;
   the step of forming at least a second material layer above said first material layer, which second material layer has a different composition from said first material layer;
   the step of forming a mask pattern required for formation of source and drain regions;
   the step of selectively removing the second material layer and then the first material layer through the mask pattern to form a first material pattern which has a width substantially equal to that of a gate electrode, in a position as is to be formed with said gate electrode, and to form a second material pattern above said first material pattern that has a width larger than that of said first material pattern;
   the step of removing said mask pattern;
   the step of forming source and drain regions by an ion implantation using said first and second material patterns as a mask;
   the step of annealing the semiconductor substrate at the positions where ion implantation has been performed;
   the step of forming source and drain electrodes in contact with said source and drain regions;
   the step of forming a third material layer, which has a selectivity with respect to said first material layer in its etching characteristics, on the semiconductor body thus far prepared by the foregoing steps;
   the step of forming at least an aperture by removing said first material pattern; and
   the step of forming said gate electrode in said aperture.

2. A field effect transistor fabricating method according to claim 1, wherein said second material layer is constructed of a plurality of sub-layers.

3. A field effect transistor fabricating method according to claim 1, wherein said third material layer is constructed of a plurality of sub-layers.

4. A field effect transistor fabricating method according to claim 3, wherein said third material layer is laminated of an inorganic material sub-layer, which has a selectivity with respect to said first material layer in its etching characteristics, and an organic high molecular weight material sub-layer.

5. A field effect transistor fabricating method according to claim 3, wherein said third material layer is constructed of an organic high-molecular weight material layer which has a selectivity with respect to said first material layer in its etching characteristics.

6. A field effect transistor fabricating method according to claim 1, wherein said semiconductor substrate is made of Group III-V material.

7. A field effect transistor fabricating method according to claim 1, wherein said third material layer acts as a mask in removing the first material pattern.

8. A field effect transistor fabricating method according to claim 1, wherein, prior to forming the first material layer, the semiconductor substrate is covered with a protective film.

9. A field effect transistor fabricating method according to claim 1, wherein the materials of said first material layer and the second material layer are resistant to heat at the temperature at which said annealing is performed.

10. A field effect transistor fabricating method according to claim 1, wherein the material of the first material layer is selected from the group consisting of Silicon Nitride, $SiO_2$, polycrystalline silicon, Ti, Mo, $TiSi_2$ and $MoSi_2$ and the material of the second material layer is selected from the group consisting of $SiO_2$ and Silicon Nitride.

11. A field effect transistor fabricating method according to claim 10, wherein the third material layer includes a layer of photo-resist.

12. A field effect transistor fabricating method according to claim 10, wherein the third material layer includes at least one first sub-layer of a material selected from the group consisting of $SiO_2$, polycrystalline silicon and Silicon Nitride, nitride, and at least one second sub-layer of a photo-resist material.

13. A method of fabricating a field effect transistor, comprising:
   the step of forming a surface portion of a semiconductor substrate with an impurity region for a channel;
   the step of forming a first material layer above said semiconductor substrate;
   the step of forming at least a second material layer above said first material layer, which second material layer has a different composition from said first material layer;
   the step of forming a mask pattern required for formation of source and drain regions;
   the step of selectively removing the second material layer and then the first material layer through said mask pattern, to form a first material pattern which has a width substantially equal to that of a gate electrode, in a position in which said gate electrode is to be formed, and to form a second material pattern above said first material pattern that has a width larger than that of said first material pattern;

the step of removing said mask pattern;

the step of forming source and drain regions by an ion implantation using said first and second material patterns thus formed as a mask;

the step of annealing the semiconductor substrate at the position where the ion implantation has been performed;

the step of forming an inorganic insulating layer on the semiconductor body thus far prepared by the foregoing steps;

the step of removing those regions of said inorganic insulating layer, which are to be formed with source and drain electrodes;

the step of forming said source and drain electrodes in contact with said source and drain regions;

the step of forming a third material layer, which has a selectivity with respect to said first material layer in its etching characteristics, on the semiconductor body thus far prepared by the foregoing steps;

the step of forming at least an aperture by removing said first material layer; and the step of forming said gate electrode in said aperture.

14. A field effect transistor fabricating method according to claim 13, wherein said semiconductor substrate is made of Group III-V material.

15. A field effect transistor fabricating method according to claim 13, wherein said third material layer acts as a mask in removing the first material pattern.

16. A field effect transistor fabricating method according to claim 13, wherein the material of the first material layer is selected from the group consisting of Silicon Nitride, $SiO_2$, polycrystalline silicon, Ti, Mo, $TiSi_2$ and $MoSi_2$, and the material of the second material layeer is selected from the group consisting of $SiO_2$ and Silicon Nitride.

17. A field effect transistor fabricating method according to claim 16, wherein the third material layer includes a layer of photo-resist.

18. A field effect transistor fabricating method according to claim 17, wherein the third material layer includes at least one first sub-layer of a material selected from the group consisting of $SiO_2$, polycrystalline silicon and Silicon Nitride, and at least one second sub-layer of a photo-resist material.

* * * * *